United States Patent
Botelho et al.

(10) Patent No.: US 8,025,975 B2
(45) Date of Patent: Sep. 27, 2011

(54) FRIT-CONTAINING PASTES FOR PRODUCING SINTERED FRIT PATTERNS ON GLASS SHEETS

(75) Inventors: John W Botelho, Corning, NY (US); Edward Arthur Cuellar, Canandaigua, NY (US); Michelle Nicole Haase Pastel, Horseheads, NY (US); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 366 days.

(21) Appl. No.: 12/228,449

(22) Filed: Aug. 13, 2008

(65) Prior Publication Data
US 2009/0155555 A1 Jun. 18, 2009

Related U.S. Application Data

(60) Provisional application No. 61/003,835, filed on Nov. 20, 2007.

(51) Int. Cl.
  *B32B 17/06* (2006.01)
  *B32B 5/16* (2006.01)
(52) U.S. Cl. ........ 428/432; 428/323; 428/325; 428/332; 428/403; 428/406
(58) Field of Classification Search .................. 428/323, 428/325, 332, 403, 406, 432
See application file for complete search history.

(56) References Cited

U.S. PATENT DOCUMENTS

| 5,801,108 A | 9/1998 | Huang et al. | 501/32 |
| 2004/0246204 A1 | 12/2004 | Aoki et al. | 345/60 |

FOREIGN PATENT DOCUMENTS

| JP | 2003/217347 | | 7/2003 |
| WO | 03/056879 | | 7/2003 |
| WO | 2005/052071 | | 6/2005 |
| WO | WO 2007/067402 | * | 6/2007 |

* cited by examiner

Primary Examiner — Gwendolyn Blackwell
(74) Attorney, Agent, or Firm — Siwen Chen

(57) ABSTRACT

Pastes for use in producing sintered frit patterns (14) on glass sheets (12), such as the glass sheets used as covers for OLED (18) display devices (10), are provided. The pastes include glass particles, filler particles, and a vehicle. The sizes of the filler and/or glass particles are reduced compared to prior art pastes. Reductions in porosity and surface roughness of sintered frits produced using the pastes, as well as improvements in the available process window for producing OLED packages and the hermeticity and strength of those packages, are reported.

15 Claims, 4 Drawing Sheets

FRIT-CONTAINING PASTES FOR PRODUCING SINTERED FRIT PATTERNS ON GLASS SHEETS

I. CROSS-REFERENCE TO RELATED APPLICATIONS

This application claims the benefit of priority to the U.S. Provisional Patent, Application No. 61/003,835, filed on Nov. 20, 2007, the content of which is relied upon and incorporated herein by reference in its entirety.

II. FIELD OF THE INVENTION

This invention relates to frit-containing pastes for use in producing sintered frit patterns on glass sheets, such as the glass sheets used as covers for display devices, e.g., display devices employing organic light-emitting diodes (OLEDs).

III. BACKGROUND OF THE INVENTION

OLED-based displays are currently being considered for use in many applications which presently employ liquid crystal displays (LCDs). OLED-based displays can provide brighter and clearer images than liquid crystal displays and also need less power. However, OLEDs are susceptible to damage resulting from exposure to oxygen and moisture. Such exposure may lead to a reduction in the useful life of the light emitting device. Therefore, hermetic sealing is one of basic requirements for long term performance of OLEDs.

Efforts have been made to hermetically seal OLED-based displays with organic materials, such as epoxy resins. An alternate technology with substantially better performance has been developed by Corning Incorporated, the assignee of this application. In accordance with this approach, a frit-containing paste is made by mixing glass particles, filler particles, e.g., crystalline particles, and a vehicle, e.g., a vehicle comprising one or more solvents and one or more binders and/or dispersing aids. The paste is dispensed on a glass sheet and is sintered using, for example, a high temperature furnace to produce a sintered frit pattern.

The resulting assembly, known as a frit cover glass or simply a cover, is combined with a substrate carrying one or more OLED devices. The cover and the substrate are sealed together by exposing the sintered frit pattern to laser energy. In particular, a laser beam is scanned (traversed) over the sintered frit pattern. The power density of the laser beam and the exposure time are selected so that the temperature of the frit is raised to above its softening point. In this way, the frit adheres to the substrate and forms a strong seal between the cover and substrate. Since the sintered frit is a glass and ceramic material, as opposed to an organic material, the penetration of oxygen and moisture through the frit seal is much slower than through the epoxy seals previously used to encapsulate OLED devices.

Although display devices using sintered frit seals have worked successfully in the past, such devices would benefit from improved bonding strengths, wider processing windows, lower porosities, and/or increased hermeticity. In accordance with the present invention, it has been discovered that the size distribution of the filler particles used in the pastes from which such seals are made, as well as the size distribution of the paste's glass particles, play important roles in determining these properties. As fully detailed below, it has been further discovered that by using filler and/or glass particles having specified distributions at least one and preferably all of the strength, processing window, porosity, and hermeticity parameters can be substantially improved.

IV. SUMMARY OF THE INVENTION

In accordance with a first aspect, the invention provides a paste for use in forming a sintered frit pattern (14) on a major surface of a glass sheet (12) comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, (i) the population of glass particles has a median particle size in the range of 0.5-1.5 microns, and (ii) at least 90% of the glass particles have a particle size that is less than or equal to 5.0 microns.

In accordance with a second aspect, the invention provides a paste for use in forming a sintered frit pattern (14) on a major surface of a glass sheet (12) comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, (i) the population of filler particles has a median particle size in the range of 2.5-3.5 microns, and (ii) at least 90% of the filler particles have a particle size that is less than or equal to 12 microns.

In accordance with a third aspect, the invention provides an assembly comprising a glass sheet (12) having a major surface and a sintered frit pattern (14) bonded to said major surface, said assembly being produced by:
 (a) applying a paste to said major surface in a pattern which upon sintering becomes said sintered frit pattern (14); and
 (b) sintering the paste pattern;
wherein:
 (i) the paste is a paste according to the first and/or second aspects of the invention; and
 (ii) the sintered frit pattern (14) has a nominal height (H) and, when analyzed by dynamic light scattering, 100% of the paste's filler particles have a particle size that is less than said nominal height.

Preferably, the sintered frit pattern (14) has an RMS surface roughness in the range of 1.0-2.0 microns and/or a porosity in the range of 9-13%.

In accordance with a fourth aspect, the invention provides a paste for use in forming a sintered frit pattern (14) having a nominal height H on a major surface of a glass sheet (12) comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, 100% of the paste's filler particles have a particle size that is less than H.

In accordance with a fifth aspect, the invention provides an assembly comprising a glass sheet (12) having a major surface and a sintered frit pattern (14) bonded to said major surface wherein the sintered frit pattern has an RMS surface roughness in the range of 1.0-2.0 microns, or a porosity in the range of 9-13%, or an RMS surface roughness in the range of 1.0-2.0 microns and a porosity in the range of 9-13%.

The reference numbers used in the above summaries of the various aspects of the invention are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

V. BRIEF DESCRIPTION OF THE DRAWINGS

Figure 4:
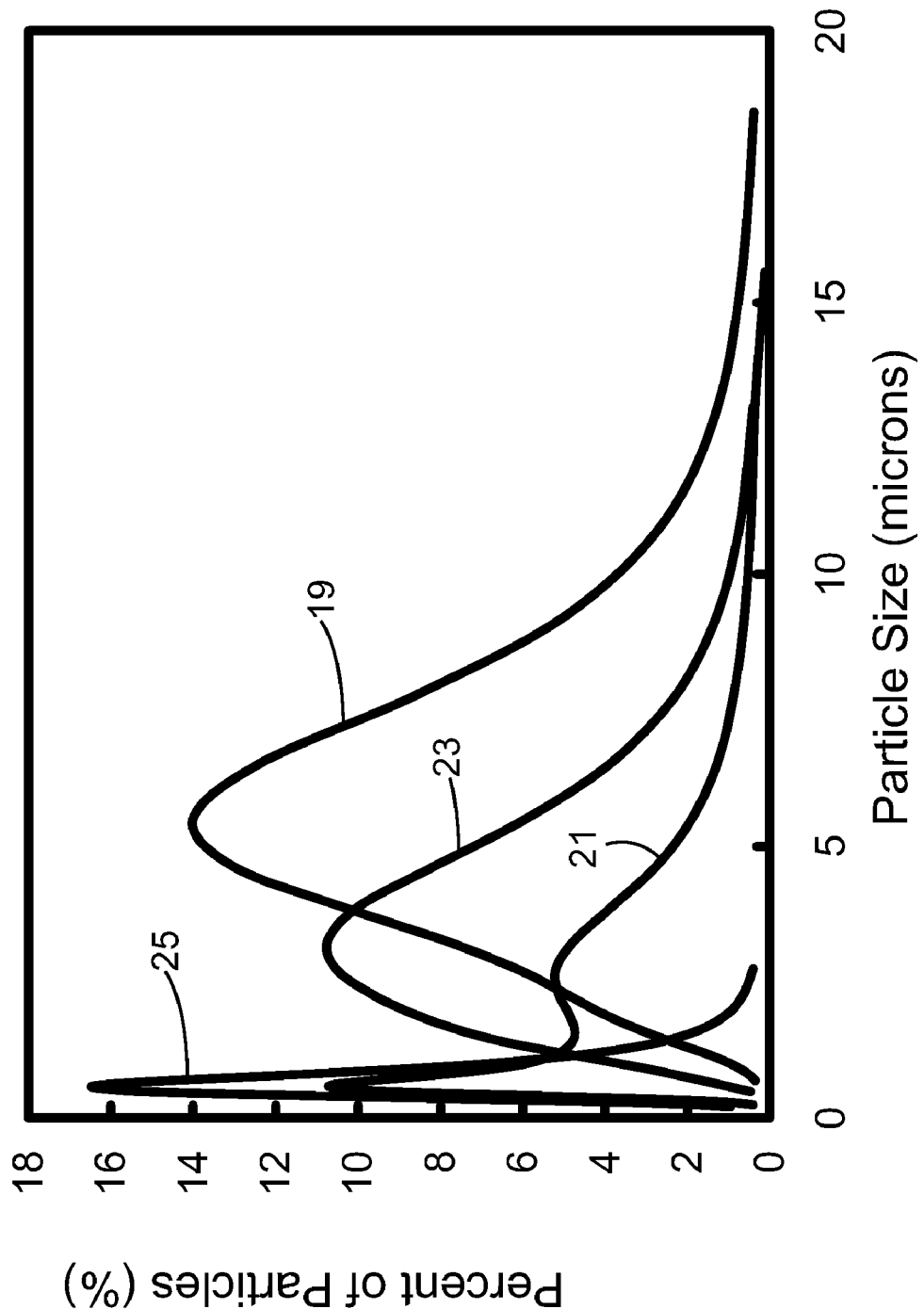

FIG. 4 is a graph showing particle distributions determined by dynamic light scattering for prior art filler particles (curve 19), prior art glass particles (curve 21), filler particles according to an embodiment of the invention (curve 23), and glass particles according to an embodiment of the invention (curve 25). The vertical axis in this figure shows the percentage of particles in the channels of the dynamic light scattering instrument used to determine the distributions and the horizontal axis shows particle size in microns.

Figure 5:
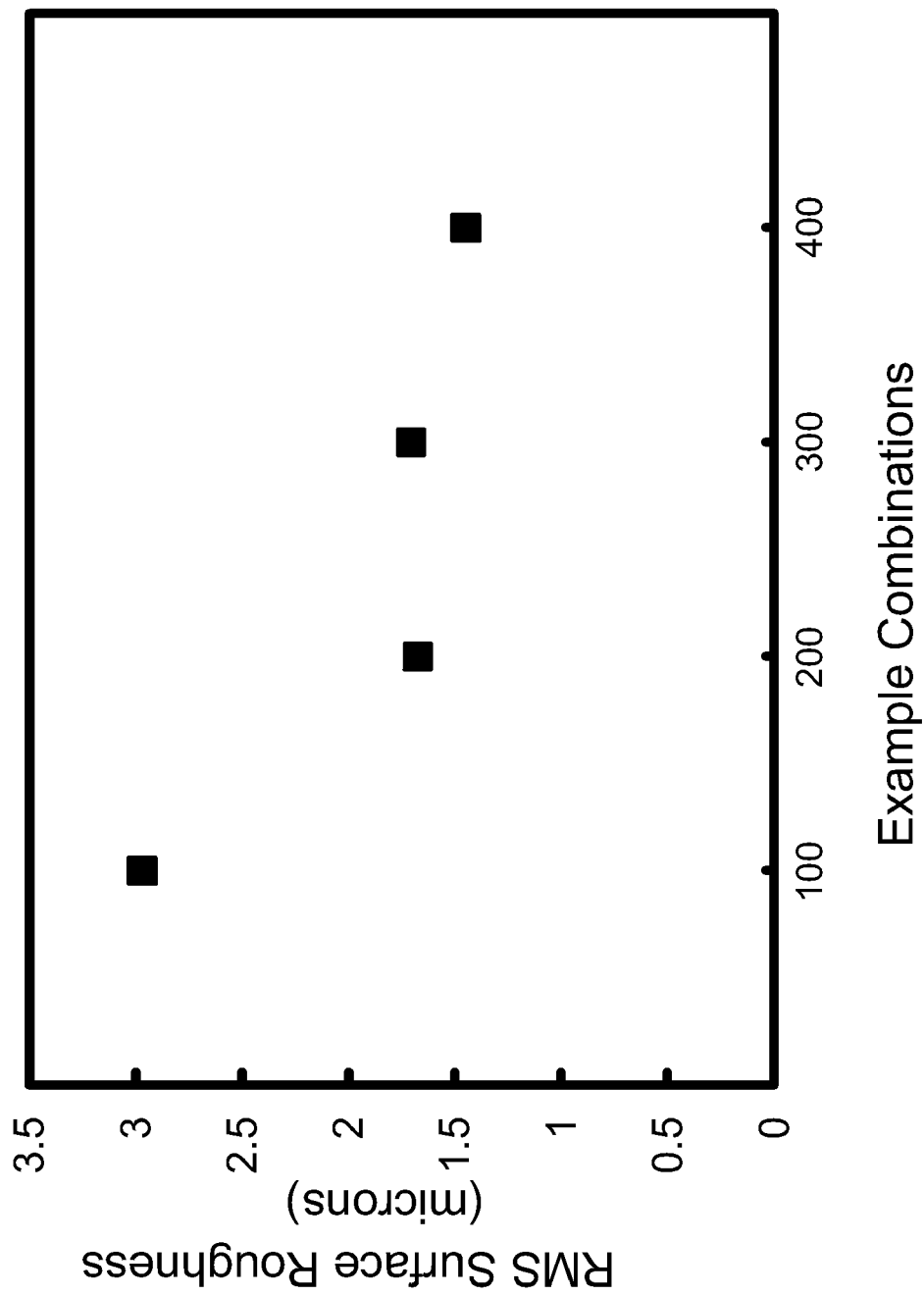

FIG. 5 is a plot of RMS surface roughness in microns (vertical axis) versus four combinations of filler and glass particles identified by the numbers 100, 200, 300, and 400 (horizontal axis). In particular, 100 corresponds to prior art glass and prior art filler particles; 200 corresponds to prior art filler particles and glass particles in accordance with an embodiment of the invention; 300 corresponds to prior art glass particles and filler particles in accordance with an embodiment of the invention; and 400 corresponds to glass particles in accordance with an embodiment of the invention and filler particles in accordance with an embodiment of the invention.

Figure 6:
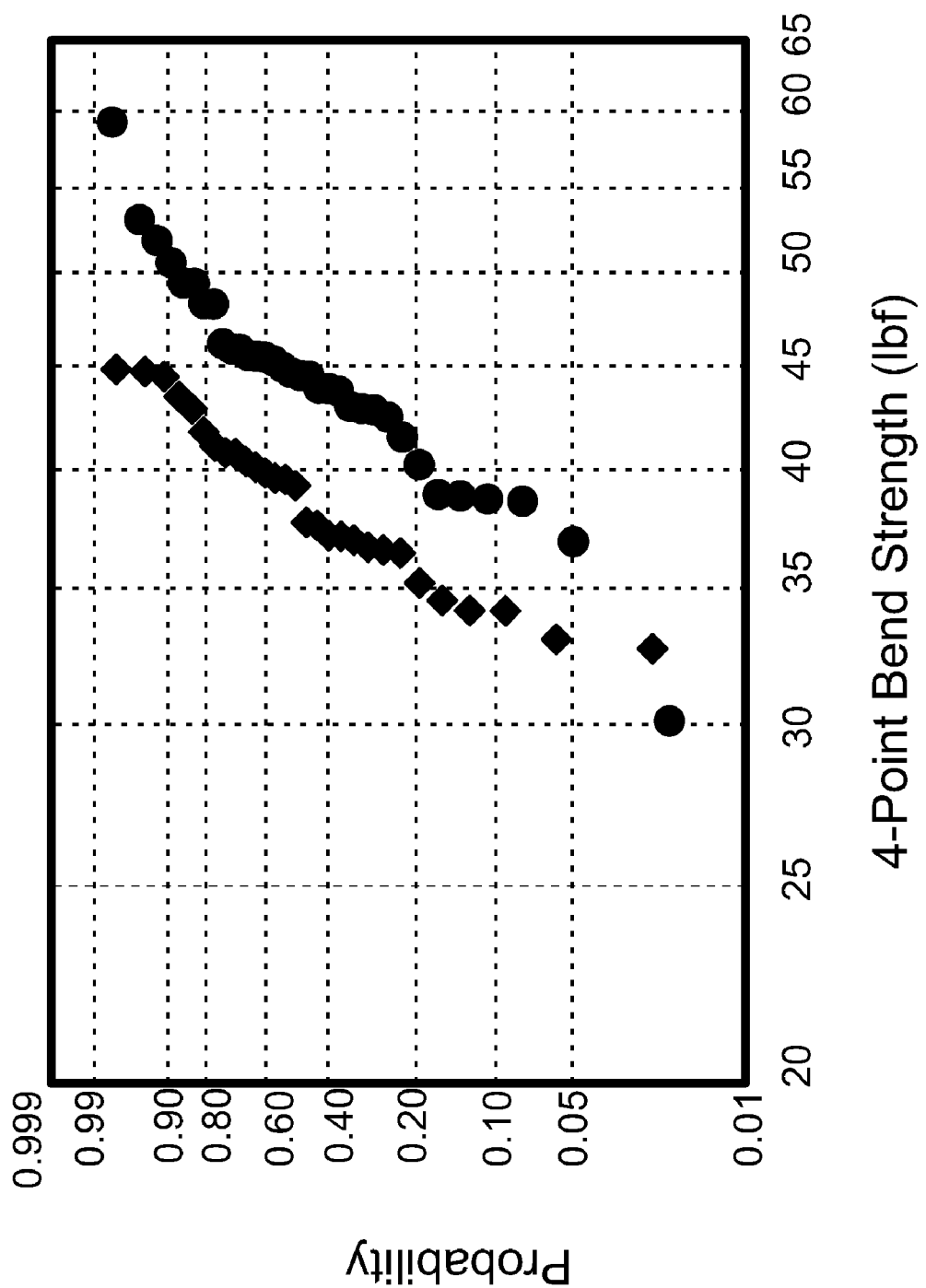

FIG. 6 is a graph comparing 4-point bending strengths of packages, e.g., OLED packages, prepared using sintered frit patterns made from pastes having different filler and particle distributions. In particular, the diamond data points of this figure are for packages made using prior art filler and prior art glass particles (Weibull slope=12.8; characteristic load=40.3) and the circular data points are for packages made using filler and glass particles in accordance with an embodiment of the invention (Weibull slope=9.7; characteristic load=46.9). The vertical axis in FIG. 6 is probability and the horizontal axis is 4-point bend strength in pounds force to failure (lbf).

VI. DETAILED DESCRIPTION OF THE INVENTION AND ITS PREFERRED EMBODIMENTS

As discussed above, in accordance with certain of its aspects, the present invention relates to frit-containing pastes for use in forming a sintered frit pattern on a major surface of a glass sheet which can be used to produce a hermetically sealed package for housing, for example, a display device, such as a display device based on organic light emitting diodes (OLEDs).

Figure 1:
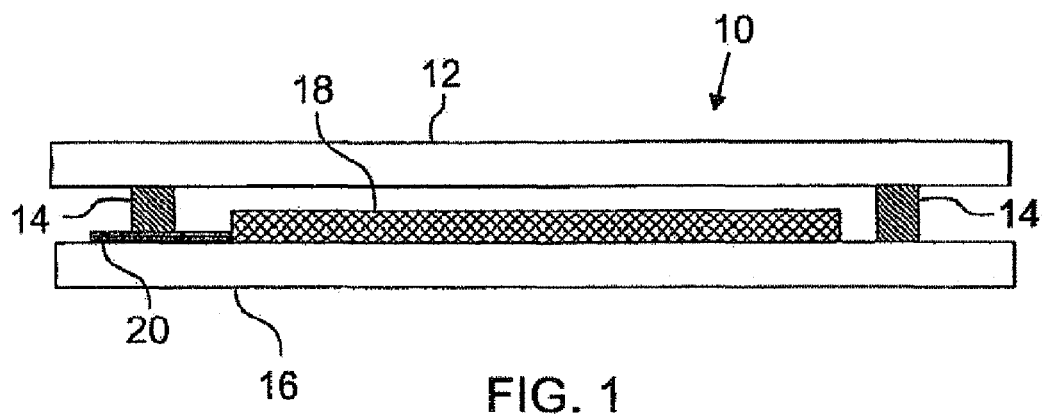
FIG. 1 is a schematic, cross sectional, side view of a display device according to an embodiment of the present invention.
Figure 2:
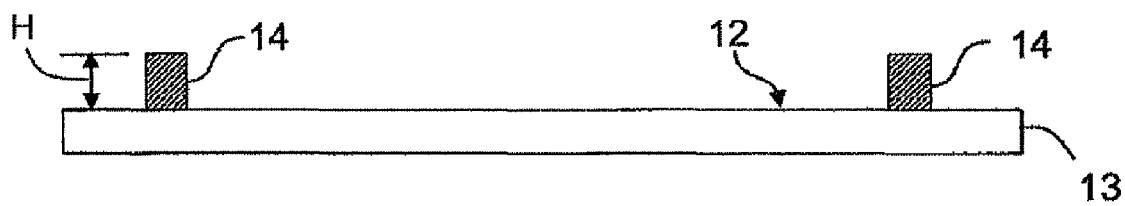
FIG. 2 is a cross sectional side view of a glass sheet with a sintered frit pattern bonded thereto in accordance with an embodiment of the present invention.
Figure 3:
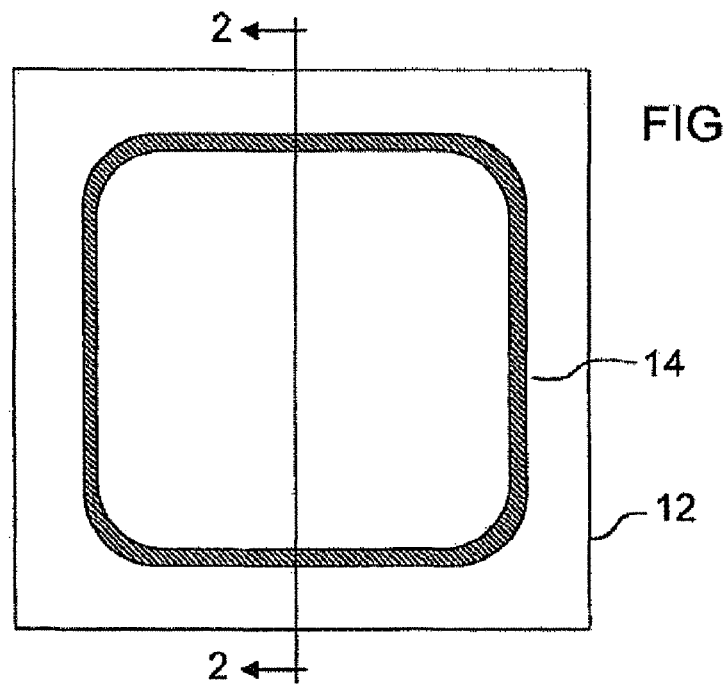
FIG. 3 is a top view of the glass sheet of FIG. 2 showing the sintered frit pattern as having the shape of a frame.

FIG. 1 is a schematic, cross-sectional, side view of a hermetically sealed OLED display device, generally designated by reference numeral 10, comprising a glass sheet 12, a sintered frit pattern 14, a substrate 16, at least one OLED element 18, and at least one electrode 20 in electrical contact with the OLED element. Typically, OLED element 18 is in electrical contact with an anode electrode and a cathode electrode. Electrode 20 in FIG. 1 is intended to represent either electrode. Although only a single OLED element is shown for simplicity, display device 10 may have many OLED elements disposed therein. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be housed in the packages of the invention besides OLED element 18. For example, thin film sensors, photovoltaic cells, lighting devices, and the like may be fabricated using the present invention.

In a preferred embodiment, glass sheet 12 is a transparent, thin glass sheet produced using the fusion process, e.g., Corning Incorporated's Code 1737, EAGLE$^{2000}$® or EAGLE XG™ glasses, or the fusion glasses produced by Nippon Electric Glass Co., NHTechno, and Samsung Corning Precision Glass Co. Alternatively, glass sheet 12 can be produced by other processes, e.g., the float process used by Asahi Glass Co. to produce OA10 glass and OA21 glass. Substrate 16 may be made of the same glass as glass sheet 12 or it may be a non-transparent substrate.

Prior to sealing glass sheet 12 to substrate 16, a frit-containing paste is deposited on a major surface of glass sheet 12 in a predetermined pattern, which is typically placed approximately 1 mm away from the free edges 13 of glass sheet 12 as a line, or a plurality of connected lines, and is typically deposited in the shape of a closed frame or wall. The paste can be applied to glass sheet 12 by, for example, screen-printing or by a programmable robot. As will be evident to persons skilled in the art, the viscosity of the paste is adjusted to be compatible with the application technique which is to be used. Thus, although described as a "paste", the compositions of the invention can in some cases have viscosities below or above those normally associated with pastes.

Preferably, after being deposited on glass sheet 12, the frit-containing paste is sintered prior to the sealing of the glass sheet to substrate 16. To accomplish this, the deposited paste can, for example, be heated so that it becomes attached to glass sheet 12, and then the glass sheet/heated paste combination can be placed in a furnace which sinters the paste (also referred to in the art as "firing" or "consolidating" the paste) to form the desired assembly of sintered frit pattern 14 bonded to glass sheet 12. Alternatively, the initial heating step can be omitted, with the glass sheet/paste pattern combination being directly placed into a furnace for sintering. As a still further alternative, the sintering can be performed by heating just the paste pattern and the surrounding glass, rather than the entire glass sheet. This localized heating can be performed on the entire paste pattern simultaneously or on sequential portions. In general, the furnace approach with an initial heating step is preferred since during the initial heating, organic components of the vehicle, e.g., organic binder materials, are burned out. The sintering temperature will, of course, depend on the composition of the paste, specifically, the composition of the paste's glass particles.

After sintered frit pattern 14 is formed, it can be ground, if necessary and desired, so that the height variation along the frit line does not exceed about 2-4 microns, with a typical target height H being 10 microns to greater than 20 microns, depending on the application for device 10; however, more typically height H is about 14-16 microns. If the height variation is larger, a gap, which may be formed between the sintered frit pattern and substrate 16 when glass sheet 12 and substrate 16 are joined, may not close when the sintered frit pattern 14 melts during laser sealing (see below), or the gap may introduce stresses which can crack the glass sheet and/or the substrate, particularly during cooling. An adequate but not overly thick frit height H allows the laser sealing to be performed from the backside of glass sheet 12. If sintered frit pattern 14 is too thin, it does not leave enough material to absorb the laser radiation, resulting in failure. If the pattern is too thick, it will be able to absorb enough energy at the glass sheet surface to melt, but will prevent the necessary energy needed to melt the sintered frit from reaching the region of the frit proximate substrate 16. This usually results in poor or spotty bonding of the glass sheet to the substrate.

If the sintered frit pattern 14 is ground, glass sheet 12 may go through a mild ultrasonic cleaning environment to remove any debris that may have accumulated. During cleaning, the temperature can be kept low to avoid degradation of the sintered frit pattern 14. After cleaning (if performed), a final processing step can be performed to remove residual moisture. For example, the assembly of glass sheet 12 and its attached sintered frit pattern 14 can be placed in a vacuum oven at a temperature of 100° C. for 6 or more hours. After removal from the oven, the assembly can be placed in a clean room box to deter accumulation of dust and debris.

The sealing process includes placing the assembly of glass sheet 12 and sintered frit pattern 14 on top of substrate 16, with one or more OLEDs 18 and one or more electrodes 20 deposited on the substrate 16, in such a manner that the sintered frit pattern, the one or more OLEDs, and the electrodes are sandwiched between the glass sheet 12 and the substrate 16 separated by the thickness of the frit pattern. Mild pressure can be applied to glass sheet 12 and substrate 16 to keep them in contact during the sealing process.

A laser beam is then directed onto frit pattern 14 through glass sheet 12. Alternatively, if substrate 16 is transparent at the sealing wavelength, sealing may be performed through substrate 16, or both through glass sheet 12 and substrate 16. In each case, the beam or beams are traversed over the sintered frit pattern to locally heat the pattern such that the glass component of the sintered frit melts and forms a hermetic seal which connects and bonds sheet 12 to substrate 16. The gap between glass sheet 12 and sheet 16 resulting from the presence of the sintered frit seal forms a hermetic envelope or package for OLED element 18. The hermetic seal of the package protects OLEDs 18 by preventing oxygen and moisture in the ambient environment from entering into OLED display 10.

The laser beam or beams used during bonding can be defocused, for example, to make the temperature gradient within the sintered frit pattern more gradual. It should be noted that if the gradient is too steep (focus is too tight), OLED display 10 may exhibit cracking and subsequent failure. The sintered frit pattern generally needs a warm up and cool down phase during melting. In addition, prior to use, the assembly of the glass substrate and sintered frit pattern is preferably stored in an inert atmosphere to prevent re-adsorption of $O_2$ and $H_2O$ before melting.

The speed of travel of the laser beam or beams relative to the frit pattern can range from between about 0.5 mm/s to as much as 300 mm/s, although a speed of between 30 mm/s and 40 mm/s is more typical. The power level of the laser beam may vary depending on the optical absorption coefficient and thickness of the sintered frit pattern. The necessary power is also affected if a reflective or absorbent layer is placed beneath the frit pattern (between the frit pattern and substrate 16) such as materials used to fabricate electrode(s) 20, and by the speed of traverse of the laser beam relative to the frit pattern. Cooling of display device 10 should be undertaken such that excess stress is not experienced by device 10 during the cooling down after the laser sealing. In addition, unless properly cooled, these stresses may result in a weak bond between the glass sheet and the substrate, and impact the hermeticity of the bond. Further details regarding the formation of hermetically-sealed packages by traversing a laser beam over a sintered frit pattern can be found in commonly-assigned U.S. Patent Application Publications Nos. 2006/0082298, 2007/0128965, 2007/0128966, and 2007/0128967, the contents of which in their entireties are incorporated herein by reference.

As discussed above, the frit-containing pastes of the present invention comprise three basic components: (1) glass particles, (2) filler particles, and (3) a vehicle. For each component, a variety of materials, now known or subsequently developed, can be used in the practice of the invention. For example, in a preferred embodiment, the glass particles are composed of a glass material having a low melting temperature and a substantial optical absorption cross-section at a wavelength which matches or substantially matches the operating wavelength of the laser used in the sealing process. By way of example, the glass making up the glass particles may contain one or more light absorbing ions chosen from the group including iron, copper, vanadium, neodymium and combinations thereof. A preferred glass for the glass particles comprises: 22.92 mole % $Sb_2O_3$, 46.10 mole % $V_2O_5$, 0.97 mole % $TiO_2$, 0.97 mole % $Al_2O_3$, 2.61 mole % $Fe_2O_3$, and 26.43 mole % $P_2O_5$.

Filler particles are included in the paste primarily to adjust the coefficient of thermal expansion of sintered frit pattern 14 so that it matches or substantially matches the coefficient of thermal expansions of glass sheet 12 and substrate 16. The filler particles can function as inversion or additive fillers. The filler particles are composed of a material having a sufficiently high melting temperature so that the filler particles will substantially maintain their shapes and sizes and, more importantly, their phase structure and thus their coefficient of thermal expansion, upon sintering of the glass particles of the paste. Examples of suitable materials for the filler particles include ceramics and, in particular, ceramics having a negative thermal expansion coefficient to offset the expansion coefficient of the sintered glass particles, a preferred material being a lithium-aluminum-silicate having a composition of 50 mole % $SiO_2$, 25 mole % $Al_2O_3$, and 25 mole % $Li_2O$.

As its name implies, the role of the vehicle is to provide a composition that can be handled by dispensing equipment and will hold the glass and filler particles in place as they are being processed to form sintered frit pattern 14. Typically, the vehicle will include one or more solvents, e.g., solvents of the type used in paints, such as, pine oil, TEXANOL, or the like, and one or more binders and/or dispersing aids, e.g., cellulose derivatives, such as, ethylcellulose, methylcellulose, or nitrocellulose, organic polymers which disassociate below the glass transition temperature of the glass particles, such as low molecular weight polypropylenes, and/or one or more surfactants. A preferred vehicle comprises TEXANOL with about 4 wt. % ethylcellulose and about 2 wt. % of a mixture of the dispersing aids SOLSPERSE and ANTI-TERRA. The components of the vehicle are chosen so that they combust and/or volatilize at sintering temperatures. Note that if the initial heating step discussed above is used, all or part of the vehicle may be combusted and/or volatized in advance of sintering. Nevertheless, in the context of the present application, a paste processed in this way would still be one having a vehicle "capable of combusting and/or volatilizing upon sintering."

The glass particles, filler particles, and vehicle can have various proportions in the frit-containing pastes of the invention. In terms of weight percent, the glass particle to filler particle ratio is selected to achieve the desired CTE of the sintered frit and the amount of vehicle is chosen to provide a rheology for the paste suitable for dispensing. The pastes can be produced by combining the particles and vehicle using conventional blending equipment and methods. For example, using the preferred particles and vehicle described above, the paste can be produced by dry mixing 70 wt. % glass particles with 30 wt. % filler particles and then blending the vehicle with the particle mixture in a ratio of three parts vehicle to one part particle mixture.

Further descriptions of glass particles, filler particles, and vehicles that can be used in the practice of the present invention can be found in commonly-assigned U.S. Patent Application Publication No. 2005/0001545, entitled "Glass Package that is Hermetically Sealed with a Frit and Method of Fabrication," which is a continuation-in-part of U.S. Pat. No. 6,998,776, the contents of both of which in their entireties are incorporated herein by reference.

As discussed above, for frit sealing, the frit height after sintering (and grinding, if used) is between 10 and 20 microns, normally about 14 to 16 microns. As shown in FIG. 4, in prior art processes (see curves 19 and 21), the median particle sizes of filler and glass particles as determined by dynamic light scattering was about 4.5 microns and 1.4 microns, respectively. However, after normal air classification of particles, a portion of particles (both glass and filler) can be substantially larger than the median. For example, some filler particles can be as large as 15 to 20 microns and some glass particles can be as large as 10-15 microns. In particular, in prior art frit-containing pastes, more than 10% of the filler particles were larger than 12 microns and more than 10% of the glass particles were larger than 5 microns.

Larger filler particles lead to higher surface roughness, and higher surface roughness has been found to prevent good contact between fritted glass sheet 12 and substrate 16. Such lack of good contact, in turn, has been found to result in laser seals that have inferior hermeticity and mechanical strength.

A further problem found to be associated with larger particles, either filler or glass, is non-uniform thermal and mechanical properties as a result of non-uniform mixing of the particles. In addition, because filler particles are not sintered during the sintering process (shape and size do not change) and do not make adhesion to the substrate during sealing, large filler particles can create weak points and act as failure origins, thus leading to lower mechanical strength, as well as jeopardizing the hermeticity of the seal.

With specific regard to the glass particles, sintering depends on particle size, and therefore, larger glass particle sizes lead to longer sintering times, or partial sintering. Partial sintering, in turn, leads to higher porosity of the sintered frit, which lowers the hermeticity of the seal and can significantly reduce the seal's mechanical strength.

In view of these considerations, in accordance with the invention, the distributions of filler particles, glass particles, or both filler and glass particles are kept within specified limits. Thus, the filler particles when analyzed by dynamic light scattering, have a median particle size in the range of 2.5-3.5 microns (preferably, 2.75-3.25 microns, more preferably, about 3 microns) and at least 90% (preferably, 95%, more preferably, essentially all) of the filler particles have a particle size that is less than or equal to 12.0 microns (preferably, less than or equal to 11.0 microns, more preferably, less than or equal to 10.0 microns), while the glass particles have a median particle size in the range of 0.5-1.5 microns (preferably, 0.75-1.25 microns, more preferably, about 1 micron) and at least 90% (preferably, 95%, more preferably, essentially all) of the glass particles have a particle size that is less than or equal to 5.0 microns (preferably, less than or equal to 4.0 microns, more preferably, less than or equal to 3.0 microns).

Curves 23 and 25 of FIG. 4 show populations of filler and glass particles having the above characteristics. The particle distributions of this figure were determined using a dynamic light scattering instrument produced by Microtrac, Inc. (Montgomeryville, Pa.), with spherical particles used as a reference. The populations were produced by further grinding of particles having the distributions of curves 19 and 21. In the case of the glass particles, the grinding was performed under an inert atmosphere to reduce oxidation of the glass as a result of the heat generated during grinding. Alternatively, the grinding equipment can be cooled to minimize such oxidation.

In terms of the filler particles, in addition to the above characteristics, it is also preferred if 100% of the filler particles have a particle size less than the nominal height H of sintered frit pattern 14. For frit patterns that are ground to achieve a more uniform height for the overall frit pattern, the height H is the height after grinding. By reducing the median filler particle size to be smaller than H (preferably, less than or equal to 0.5 H, more preferably, less than or equal to 0.3 H, most preferably, less than or equal to 0.2 H), the chance of several filler particles agglomerating together to produce a structure higher than the frit height is significantly reduced. This reduces the number of failure origins after the laser sealing, which improves process yield, mechanical strength, and hermeticity of the frit seal.

As the examples to which we now turn show, the above particle distributions have been found to produce sintered frit patterns having smoother surfaces and lower porosities. They have also been found to provide stronger OLED packages with improved hermeticity and wider processing windows for sealing such packages using laser radiation. These examples are intended to illustrate the invention but not to limit the invention as claimed below.

Example 1

Surface Roughness

This example illustrates the effects on surface roughness of reducing the size of the glass particles alone (see column 200 in FIG. 5), the filler particles alone (see column 300 in FIG. 5), or both the glass particles and the filler particles (see column 400 in FIG. 5).

With regard to the glass particles, it was found that by reducing the particle size, especially by removing the long tail of the particle size distribution, the surface roughness of a sintered frit pattern produced using the glass particles was improved.

Using Fourier analysis (auto-correlation) on the topography of a sintered frit, the root mean square average (RMS) of surface roughness was found to be reduced from 2.97 microns for the glass particles of curve 21 of FIG. 4 (see column 100 of FIG. 5) to 1.67 microns for the curve 25 glass particles (see column 200 of FIG. 5).

It was also found that reducing filler particle size alone can achieve a smoother surface. When the filler particle size was made less than 3 microns (see curve 23 of FIG. 4), the RMS of surface roughness was found to be reduced from the 2.97 micron value of curve 19 (see column 100 of FIG. 5) to 1.70 microns (see column 300 of FIG. 5). When the sizes of both glass and filler particles were reduced, the RMS further decreased to 1.45 microns (see column 400 of FIG. 5).

These reductions in surface roughness are significant improvements. When rougher frit surfaces are sealed to substrates 16 carrying OLED devices (backplanes), images taken with optical microscopes show the filler particles mechanically deform metal layers by making indentions in the leads. It has also been observed that rougher frit surfaces cause more scratches on the backplanes during the frit to backplane alignment process. In practice, these scratches have been found to adversely impact OLED operation.

Example 2

Processing Window

This example shows that the processing window for laser sealing is much wider for pastes with smaller filler particles regardless of the sizes of the glass particles. A wider sealing window is desirable since it allows the laser sealing process to be used with a greater variety of glass sheets 12, substrates 16, and OLED constructions.

As shown in Table 1, for pastes with fillers having particles primarily in the range of 3-7 microns (see curve 19 in FIG. 4), the sealing window is about 2-3 watts wide for both 10 and 20 nm/s laser sealing speeds. Also, the highest seal width (i.e., percentage of original pre-sintered width) is about 80%. With further increase of laser power, a laser track (i.e., voids along the sintered frit line after exposure to the laser beam) starts to show up, which is not desirable.

However, for pastes with small filler particles (median shifted by approximately −3 microns; see curve 23 in FIG. 4), the sealing window is about 7 to 9 watts wide, which is about three times larger than that of the prior art fillers. The lower end of the sealing window is similar to that of the prior art pastes, as is the seal width which is also shown in Table 1; however, the upper ends are much higher. Indeed, the upper end of the seal width with the curve 23 filler particles is above 90%. This shows that the process window of pastes using smaller filler particles is much larger.

Example 3

Package Strength

FIG. 6 illustrates that pastes with smaller fillers show higher mechanical strength.

The seal width in this case was about 88%. For this width, the frits with small filler particles (curve 23 in FIG. 4; circular data points in FIG. 6) was stronger than those with larger filler particles (curve 19 in FIG. 4; diamond data points in FIG. 6). The characteristic load, $S_0$, was 40.3 lbf for the large filler paste, and 46.9 lbf for the small filler one. The improvement of the small filler paste is thus about 15%. As can be seen in FIG. 6, other than for 6 samples, the strength of the 28 samples tested was higher than 40 lbf.

Example 4

Hermeticity

Four glass sheets with sintered frit patterns formed using a paste having small filler particles (i.e., the filler particles of curve 23 of FIG. 4) were sealed to sheets with an internal Ca patch used to test hermeticity. Two were sealed at a laser speed of 10 mm/s and the other two at 20 mm/s. The thickness of the Ca patch was 750 nm. Each sheet was sealed using the optimal laser power within the sealing window.

After sealing, all sheets were put into a 85° C.-85 RH % (relative humidity) chamber to test the long term hermeticity performance of the package. After more than 3000 hrs, not a single cell based on a frit with the small filler particles lost hermeticity. Also, leaching from the sintered frit was not observed in any of the test packages.

Example 5

Porosity

Table 2 shows the results of tests of porosity for sintered frits produced using the various particle distributions of FIG. 4. Porosity was measured optically by sectioning the frit and determining the void volume.

As can be seen in Table 2, reducing glass particle size reduces the porosity of the sintered frit from 17.85% to 12.77%, while a reduction of both glass and filler particle sizes, further reduces the porosity to 9.84%. Lower porosity leads to a sintered frit with more uniform physical and thermal properties, better heat transfer, and higher mechanical strength.

From the foregoing, it can be seen that a reduction in glass particle size, especially to remove the long distribution tail, reduces porosity in a sintered frit, but is not essential to improve laser processing window or package mechanical strength; reduction in filler particle size improves the frit sealing process in that it results in a smoother sintered frit surface, a wider processing window, and greater mechanical strength. Reduction of both glass and filler particle sizes provide all these benefits.

A variety of modifications which do not depart from the scope and spirit of the invention will be evident to persons of ordinary skill in the art from the foregoing disclosure. As just one example, the pastes of the invention can be used with glasses other than those currently employed with OLEDs, such as soda lime or borosilicate glasses, which are currently being used in lighting devices, e.g., the pastes can be used with Corning Incorporated's Code 0211 Microsheet glass. The following claims are intended to cover the specific embodiments set forth herein as well as such modifications, variations, and equivalents.

TABLE 1

| Laser Sealing speed (mm/s) | Paste with curve 21 glass particles and curve 19 filler particles | Paste with curve 25 glass particles and curve 19 filler particles | Paste with curve 21 glass particles and curve 23 filler particles | Paste with curve 25 glass particles and curve 23 filler particles |
|---|---|---|---|---|
| 10 | 22-24 w (77-81%) | 22-24 w (73-80%) | 23-31 w (78-93%) | 24-31 w (76-91%) |
| 20 | 32-35 w (80-83%) | 33-35 w (78-79%) | 34-41 w (76-90%) | 32-41 w (76-94%) |

TABLE 2

| | Paste with curve 21 glass particles and curve 19 filler particles | Paste with curve 25 glass particles and curve 19 filler particles | Paste with curve 21 glass particles and curve 23 filler particles | Paste with curve 25 glass particles and curve 23 filler particles |
|---|---|---|---|---|
| Porosity (%) | 17.85 | 12.77 | 20.3 | 9.84 |

What is claimed is:

1. A paste for use in forming a sintered frit pattern on a major surface of a glass sheet comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, (i) the population of glass particles has a median particle size in the range of 0.5-1.5 microns, and (ii) at least 90% of the glass particles have a particle size that is less than or equal to 5.0 microns.

2. A paste for use in forming a sintered frit pattern on a major surface of a glass sheet comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, (i) the population of filler particles has a median particle size in the range of 2.5-3.5 microns, and (ii) at least 90% of the filler particles have a particle size that is less than or equal to 12 microns.

3. The paste of claim 2 wherein, when analyzed by dynamic light scattering, (i) the population of glass particles has a median particle size in the range of 0.5-1.5 microns, and (ii) at least 90% of the glass particles have a particle size that is less than or equal to 5.0 microns.

4. An assembly comprising a glass sheet having a major surface and a sintered frit pattern bonded to said major surface, said assembly being produced by:
 (a) applying a paste to said major surface in a pattern which upon sintering becomes said sintered frit pattern; and
 (b) sintering the paste pattern;
wherein:
 (i) the paste is a paste according to claim 2; and
 (ii) the sintered frit pattern has a nominal height and, when analyzed by dynamic light scattering, 100% of the paste's filler particles have a particle size that is less than said nominal height.

5. The assembly of claim 4 wherein the sintered frit pattern has an RMS surface roughness in the range of 1.0-2.0 microns.

6. The assembly of claim 4 wherein the sintered frit pattern has a porosity in the range of 9-13%.

7. A display device comprising the assembly of claim 4 bonded to a substrate by means of said sintered frit pattern.

8. The display device of claim 7 wherein bonding of the assembly to the substrate is performed by traversing the sintered frit pattern with radiation produced by a laser.

9. A paste for use in forming a sintered frit pattern having a nominal height H on a major surface of a glass sheet comprising:
 (a) a population of glass particles which melt upon sintering;
 (b) a population of filler particles which substantially maintain their shapes and sizes upon sintering; and
 (c) a vehicle which is capable of combusting and/or volatilizing upon sintering;
wherein, when analyzed by dynamic light scattering, 100% of the paste's filler particles have a particle size that is less than H.

10. The paste of claim 9 wherein, when analyzed by dynamic light scattering, (i) the population of glass particles has a median particle size in the range of 0.5-1.5 microns, and (ii) at least 90% of the glass particles have a particle size that is less than or equal to 5.0 microns.

11. The paste of claim 9 wherein, when analyzed by dynamic light scattering, (i) the population of filler particles has a median particle size in the range of 2.5-3.5 microns, and (ii) at least 90% of the filler particles have a particle size that is less than or equal to 12 microns.

12. The paste of claim 11 wherein, when analyzed by dynamic light scattering, (i) the population of glass particles has a median particle size in the range of 0.5-1.5 microns, and (ii) at least 90% of the glass particles have a particle size that is less than or equal to 5.0 microns.

13. An assembly comprising a glass sheet having a major surface and a sintered frit pattern bonded to said major surface wherein the sintered frit pattern has an RMS surface roughness in the range of 1.0-2.0 microns, or a porosity in the range of 9-13%, or an RMS surface roughness in the range of 1.0-2.0 microns and a porosity in the range of 9-13%.

14. A display device comprising the assembly of claim 13 bonded to a substrate by means of said sintered frit pattern.

15. The display device of claim 14 wherein bonding of the assembly to the substrate is performed by traversing the sintered frit pattern with radiation produced by a laser.

* * * * *